(12) United States Patent
Abe

(10) Patent No.: US 6,455,430 B2
(45) Date of Patent: *Sep. 24, 2002

(54) METHOD OF EMBEDDING CONTACT HOLE BY DAMASCENE METHOD

(75) Inventor: Kazuhide Abe, Tokyo (JP)

(73) Assignee: Oki Electric Industry Co., Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/431,181

(22) Filed: Nov. 1, 1999

(30) Foreign Application Priority Data

Feb. 18, 1999 (JP) .......................... 11-040220

(51) Int. Cl.⁷ ............................. H01L 21/302
(52) U.S. Cl. .................. 438/691; 438/692; 438/694
(58) Field of Search .................. 438/690, 691, 438/692, 693, 694, 634, 633, 635, 637

(56) References Cited

U.S. PATENT DOCUMENTS

| | | | |
|---|---|---|---|
| 5,612,254 A | * 3/1997 | Mu et al. | 438/237 |
| 5,614,765 A | 3/1997 | Avanzino et al. | 257/774 |
| 5,633,207 A | * 5/1997 | Yano et al. | 438/645 |
| 5,686,354 A | 11/1997 | Avanzino et al. | 438/250 |
| 5,795,823 A | 8/1998 | Avanzino et al. | 438/639 |
| 5,930,669 A | * 7/1999 | Uzoh | 438/627 |
| 5,976,928 A | * 11/1999 | Kirlin et al. | 438/240 |
| 6,016,008 A | * 1/2000 | Feldner | 257/751 |
| 6,025,259 A | * 2/2000 | Yu et al. | 438/618 |
| 6,103,625 A | * 8/2000 | Marcyk et al. | 438/691 |
| 6,131,258 A | * 10/2000 | Saenger et al. | 29/25.42 |
| 6,150,272 A | * 11/2000 | Liu et al. | 438/692 |
| 6,174,813 B1 | * 1/2001 | Wang | 438/692 |

FOREIGN PATENT DOCUMENTS

JP 9-64034 7/1997

* cited by examiner

Primary Examiner—Benjamin L. Utech
Assistant Examiner—Ian Vinh
(74) Attorney, Agent, or Firm—Volentine Francos, PLLC

(57) ABSTRACT

A carbon film is formed over an insulating film and a contact hole is defined therein by patterning. Copper is formed over an entire surface including the contact hole and polished by chemical mechanical polishing. The polishing of the copper is terminated with the carbon film as an etching stopper thereby to allow the copper to remain in the contact hole alone, whereby an embedded interconnection made up of the copper is formed by a damascene method.

29 Claims, 4 Drawing Sheets

METHOD OF EMBEDDING CONTACT HOLE BY DAMASCENE METHOD

BACKGROUND OF THE INVENTION

1. Field of the Invention

This invention relates to a method of forming an interconnection used in a semiconductor device, and particularly to a method of forming an embedded interconnection by a damascene method using copper.

2. Description of the Related Art

Attention has been given to Cu as the next-generation wiring material as an alternative to an aluminum wire or interconnection. This is because excellent electromigration resistance is obtained while it has of course a low resistance of $1.69 \times 10^{-6}$ ohmcm. Two processing methods: Chemical Mechanical Polishing (hereinafter called "CMP") and Reactive Ion Etching are considered to form a Cu interconnection. Since, however, it is difficult to apply the conventional RIE method to the formation of the Cu interconnection because Cu halide is low in vapor pressure, the formation of a damascene interconnection using CMP is now mainstream.

However, CMP used for Cu has a big problem in that 1) a dent or recess defined in a wired portion by chemical etching through an oxidizing agent in a polishing solution, 2) thinning of an interconnection, which is developed due to the cutting of an insulating film, which is called "dishing", and 3) etc. occur. The recess described in the paragraph 1) can be improved by the optimization of the ratio of mixture of a slurry and an oxidizing agent. The thinning described in the paragraph 2) can be improved by selecting the optimal abrasive cloth. However, the trouble described in the paragraph 3) results from the fact that since the polishing speed of Cu within a wafer surface is non-uniform, Cu and an interlayer insulating film must be overpolished at their given portions. It was therefore difficult to solve such a problem.

SUMMARY OF THE INVENTION

The present invention provides a method of depositing Cu and a C (carbon) film having a high selection ratio over an interlayer insulating film and thereafter defining a contact hole therein, forming Cu over an entire surface including the contact hole, polishing Cu by CMP, terminating the polishing of Cu by a stopper film of the C film, and forming an embedded interconnection in the contact hole.

An object of the present invention is to deposit Cu and a material having a high selection ratio over an interlayer insulating film thereby to restrain the occurrence of thinning of Cu upon CMP and provide a damascene Cu interconnection processed with high accuracy.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

A first embodiment of the present invention will first be explained with reference to FIG. 1.

Figure 1A:
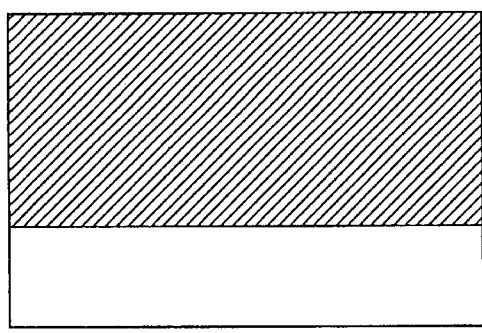
FIGS. 1A–1F are process diagrams showing a first embodiment of the present invention, for forming an embedded interconnection by a damascene method.
Figure 1B:
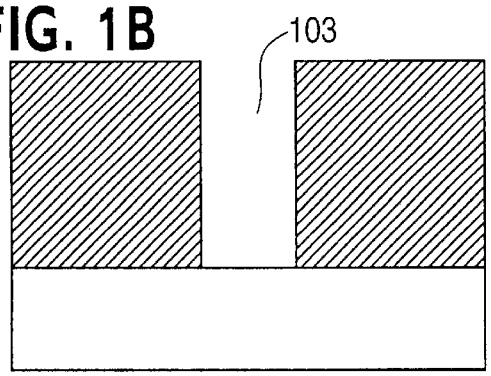

An intermediate insulating film 102 is formed over a semiconductor substrate 101 (see FIG. 1A). The intermediate insulating film 102 is polished a predetermined amount by CMP to globally flatten a cell portion and its peripheral portion. A contact hole 103 is formed by the known lithography and etching techniques under a layout corresponding to a pattern to be formed (see FIG. 1B).

Next, a Ti (titanium) film 104 having a film thickness of 700 Å and a TiN (titanium nitride) film 105 having a film thickness of 500 Å are continuously grown and formed in a vacuum by sputtering for enhancing directivity. For example, the Ti film is formed on condition that power is 1 KW and film-forming pressure is 2 mTorr while an Ar (argon) gas is being introduced, whereas the TiN film is formed on condition that power is 5 KW and film-forming pressure is 9 mTorr while an N2 (nitrogen) gas is being introduced. After the TiN film 105 has been subjected to rapid thermal nitridation (RTN) at a temperature of 650° C. for 30 seconds, a W (tungsten) film 106 is deposited over the intermediate insulating film 102 by 6000 Å by CVD. Next, unnecessary W at other than the contact hole 103 is removed by etchback thereby to form a W plug (see FIG. 1C).

After the formation of the W plug, an interlayer insulating film 107 having a thickness of 7000 Å is deposited by CVD and a C film 108 having a thickness of 200 Å is deposited by sputtering. The sputter C (carbon) film is formed on condition that power is 3 KW and film-forming pressure is 5 mTorr while the Ar gas is being introduced. A groove 109 is defined in an underbed having the interlayer insulating film 107 and the C film 108 formed therein by the known lithography and etching techniques according to a layout corresponding to a pattern to be formed (see FIG. 1D). In a resist removal process subsequent to etching, however, a resist is removed by an organic releasant or the like without having to use ashing. This processing is done to prevent the C film 108 from being removed together with the resist by ashing.

Next, an insulating film 110 having a thickness of 300 Å is grown by CVD. Etchback processing is effected on only side wall portions of the groove to leave behind the insulating film 110. Since the specific resistivity of a bulk C ranges from 4 to $7 \times 10^{-5}$ ohmcm, it is necessary to isolate the subsequently-formed interconnection from its adjacent interconnection by side walls of the insulating film when the bulk C is left behind. Thereafter, a Ti film 111 having a film thickness of 100 Å and a TiN film 112 having a film thickness of 400 Å are continuously grown in a vacuum by sputtering.

Next, a Cu film 113 is deposited by 6000 Å as a thin film by sputtering. Power at sputtering is set to 8 KW and Ar pressure is set to 0.8 mTorr. An underbed having the Cu thin film 113 formed therein is heat-treated in an ultra-high vacuum (corresponding to a vacuum of about $1 \times 10^{-10}$ torr in the present embodiment) without being taken out from a film-forming chamber of a sputter device. Cu reflows owing to the heat treatment, so that Cu can be embedded into the groove 109 (see FIG. 1E).

Next, the unnecessary Cu film, TiN film and Ti film other than at the groove portion are removed by CMP. A slurry to be used is based on $Al_2O_3$ and the slurry and $H_2O_2$ are mixed together in the proportions of 3:1. A downforce of a carrier is defined as 3 psi and carrier and table speeds are respectively set to 30 rpm. At this time the Cu film can be cut away or shaved on the order of 4000 Å by one-minute polishing, whereas the C film can be cut by a few Å. Thus, an abrasive selection ratio between Cu and C is 1000 or more. As compared with the conventional abrasive selection ratio 100 between Cu and the interlayer insulating film, it is understood that an improvement in the abrasive selection ratio reaches ten times or more the conventional abrasive selection ratio. When the unnecessary Cu film, TiN film and Ti film have been removed, a desired Cu interconnection 114 is obtained (see FIG. 1F). According to the first embodiment as described above, since the C film serves as a stopper even if overpolishing is done, a high-accuracy Cu interconnection can be formed.

A second embodiment of the present invention will next be described with reference to FIG. 2.

Figure 1C:
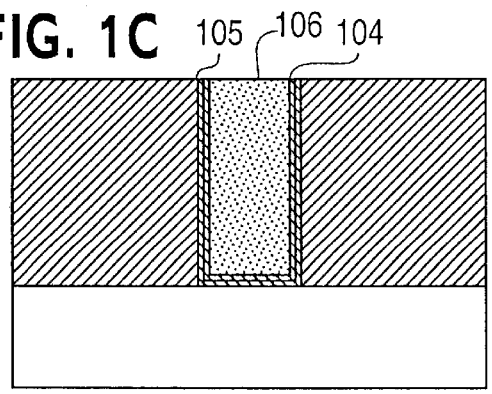
Figure 2A:
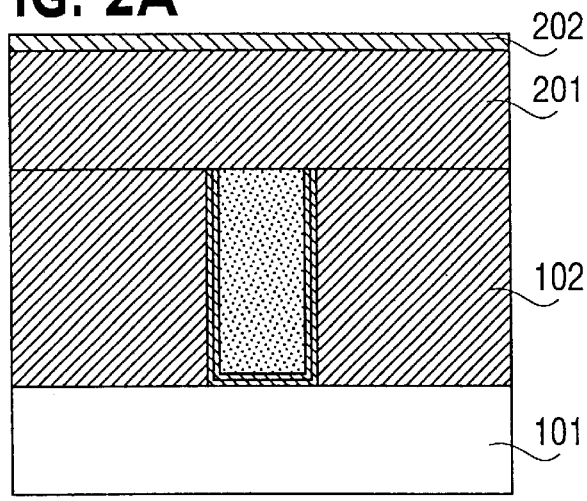
FIGS. 2A–2C are process diagrams illustrating a second embodiment of the present invention, for forming an embedded interconnection by the damascene method.
Figure 2B:
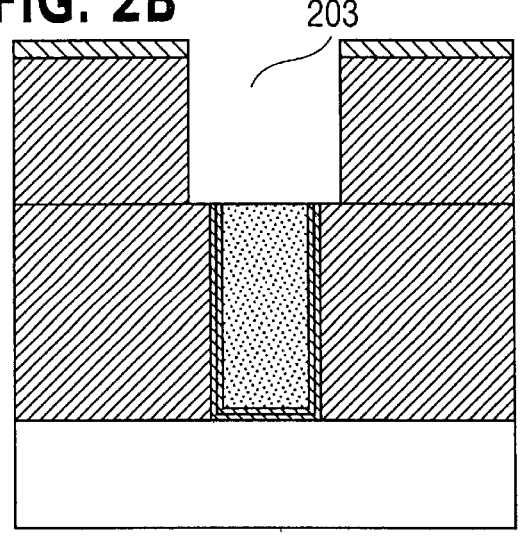
Figure 2C:
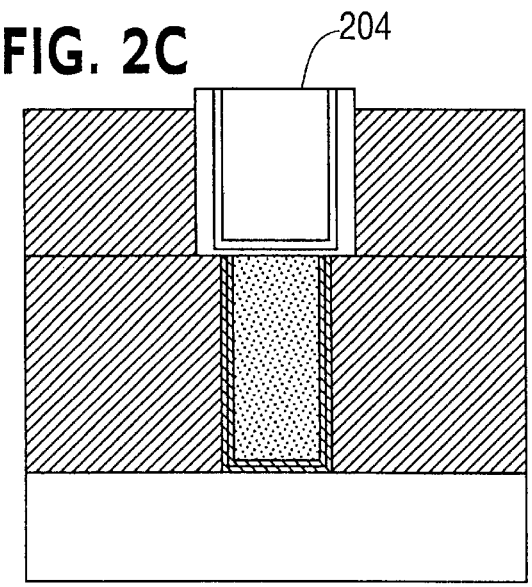

After the same process steps (their description will be omitted) as those up to FIG. 1C have been completed, an interlayer insulating film 201 having a thickness of 7000 Å and a C film 202 having a thickness of 200 Å are deposited from a lower layer by CVD and sputtering respectively in FIG. 2A. A groove 203 is defined in an underbed having the interlayer insulating film 201 and the C film 202 formed therein by the known lithography and etching techniques according to a layout corresponding to a pattern to be formed (see FIG. 2B). In a resist removal process step subsequent to etching, however, a resist is removed by an organic releasant or the like without having to use ashing. This processing is performed to prevent the C film 202 from being removed by ashing together with the resist.

Figure 1D:
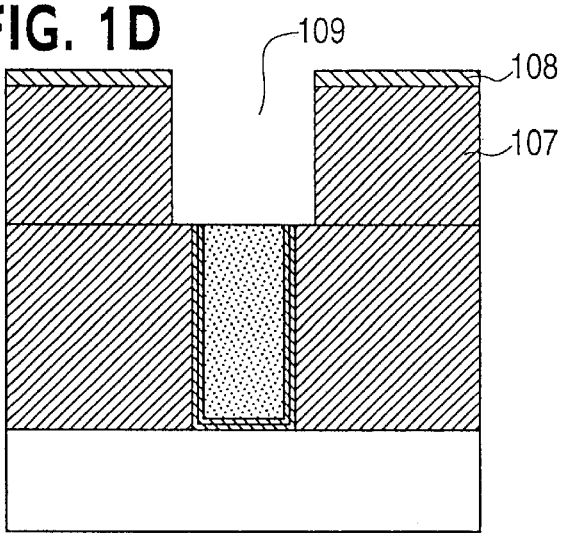
Figure 1E:
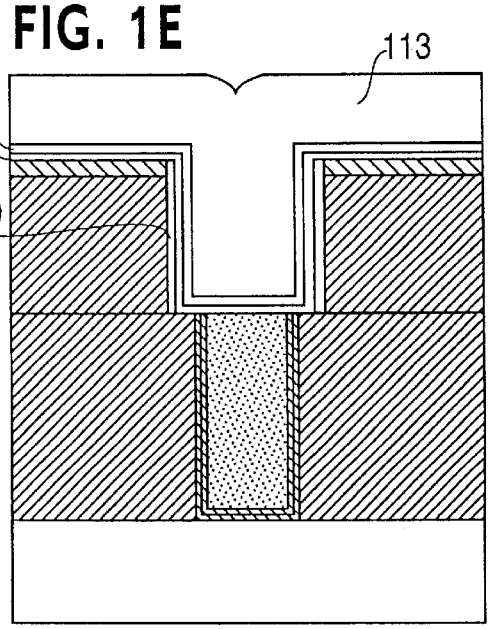
Figure 1F:
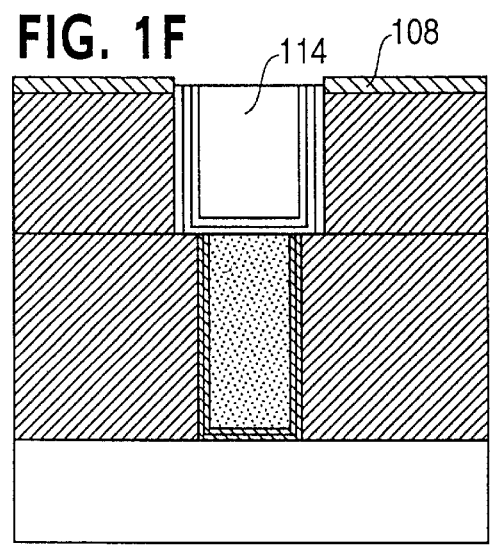

The process steps shown in FIGS. 1D through 1F are subsequently effected in the same manner as described above thereby to obtain a desired Cu interconnection 204. Next, since C of a bulk has specific resistivities of 4 to $7 \times 10^{-5}$ ohmcm, the C film 202 is removed by downflow ashing (see FIG. 2C). A combination of the downflow ashing and ultrasonic cleaning makes it possible to restrain the resistance of the Cu interconnection 204 from increasing. According to the second embodiment as described above, since the C film serves as a stopper even if overpolishing is done, a high-accuracy Cu interconnection can be formed. It is also unnecessary to cover the C film whose in-groove side walls are bare, with a insulating film, so that the process is simplified.

A third embodiment of the present invention will next be described with reference to FIG. 3.

Figure 3A:
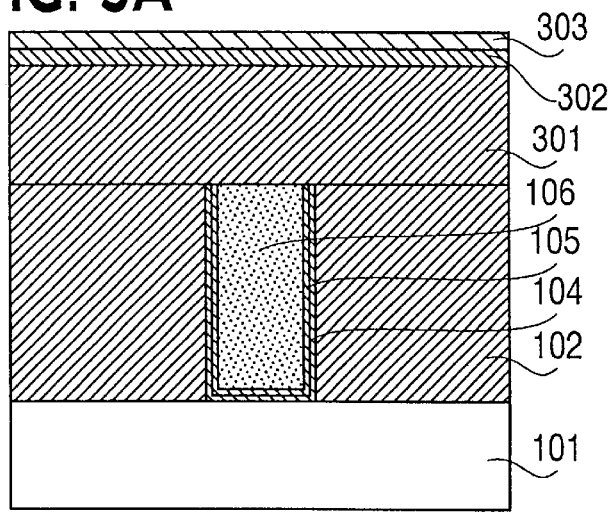
FIGS. 3A–3C are process diagrams showing a third embodiment of the present invention, for forming an embedded interconnection by the damascene method.
Figure 3B:
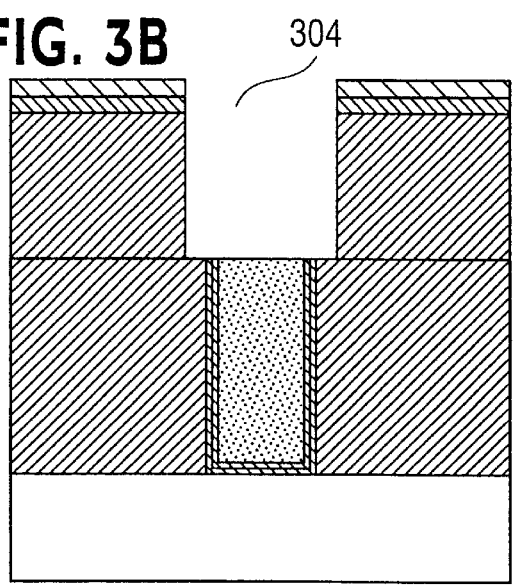
Figure 3C:
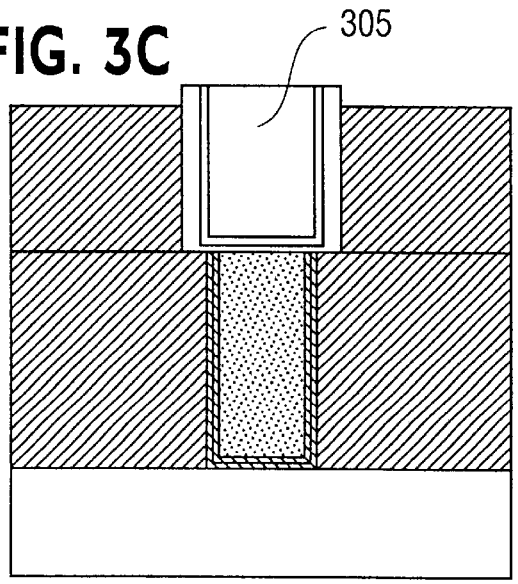

After the same process steps (their description will be omitted) as those up to FIG. 1C have been completed, an interlayer insulating film 301, a C film 302 and a TiN film 303 are respectively deposited by 7000 Å, 200 Å and 150 Å from a lower layer in FIG. 3A. A groove 304 is defined in an underbed formed with a multilayered film of the interlayer insulating film 301, the C film 302 and the TiN film 303 by the known lithography and etching techniques according to a layout corresponding to a pattern to be formed (see FIG. 3B).

In the structure according to the present embodiment, since the surface of the C film is covered with the TiN film 303, it is protected from an oxygen plasma at ashing. Therefore, the ashing can be used in a resist removing process step subsequent to etching as conventional. Next, the process steps shown in FIGS. 1D through 1F are similarly effected to obtain a desired Cu interconnection 305. Subsequently, ultrasonic surface cleaning is performed after the C film 302 has been removed by downflow ashing (see FIG. 3C).

According to the third embodiment as described above, since the C film serves as a stopper even if overpolishing is done, a high-accuracy Cu interconnection can be formed. Further, the use of a TiN film/C film multilayered structure allows the use of the conventional etching process for the resist removing process step, thereby making it possible to remove a thermally-transformed resist and a deposited film at etching.

A fourth embodiment of the present invention will next be explained with reference to FIG. 4.

Figure 4A:
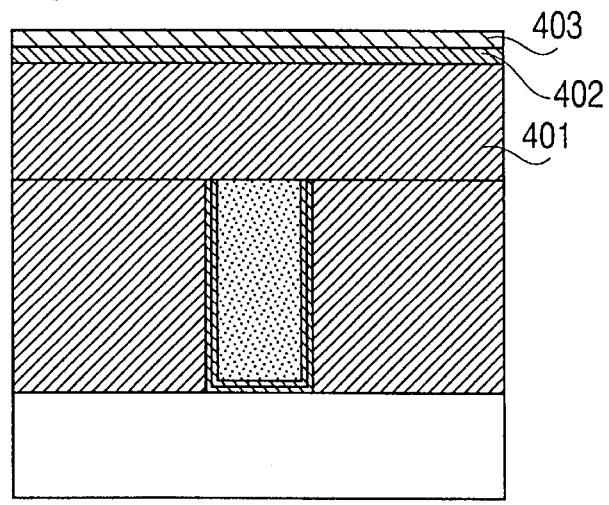
FIGS. 4A–4C are process diagrams showing a fourth embodiment of the present invention, for side-etching a stopper film when an embedded interconnection is formed by the damascene method.
Figure 4B:
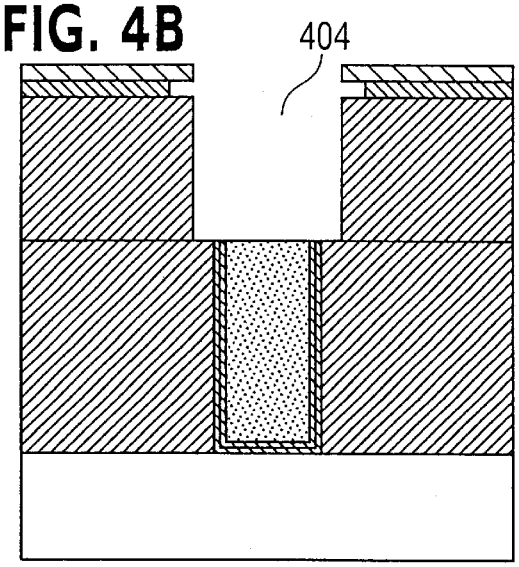
Figure 4C:
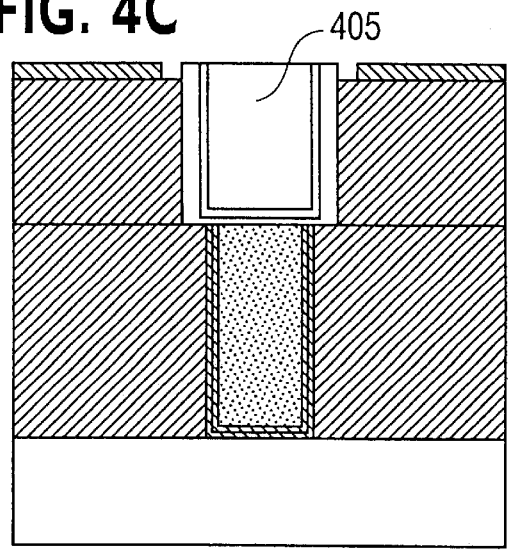

After the same process steps as those up to FIG. 1C have been completed, an interlayer insulating film 401, a C film 402 and a TiN film 403 are respectively deposited by 7000 Å, 200 Å and 150 Å from a lower layer in FIG. 4A. Thereafter, a resist is exposed according to a formed groove pattern by a photolithography technique. Next, the TiN film 403 is etched, the C film 402 make dents in its side walls by isotropic etching using the known etching gas, e.g., a $CHF_3/CH_4/Ar$ gas, and the interlayer insulating film 401 is etched, thereby defining a groove 404 (see FIG. 4B).

Next, the process steps shown in FIGS. 1D through 1F are similarly executed to thereby obtain a desired Cu interconnection 405. Subsequently, ultrasonic surface cleaning is carried out after the C film 402 has been removed by downflow ashing (see FIG. 4C). According to the present embodiment as described above, since the C film is dented or recessed in a TiN film/C film multilayered structure, the damascene Cu interconnection and the C film do not make contact with each other and both are isolated from each other by an interlayer insulating film to be deposited next. It is therefore possible to omit the C film removing process step. Further, the C films employed in the first through fourth embodiments may be carbon compounds such as CN, BC, etc.

According to the present invention as described above, the deposition of a C film over an interlayer insulating film permits implementation of a high-polishing selection ratio between Cu and C. Since the C film serves as a stopper even if overpolishing is done, a thinning-free damascene Cu interconnection can be formed.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of embedding a contact hole by a damascene method, comprising:

forming an insulating film over an underbed having a contact plug;

successively forming a stopper film and a protective film over an entire surface including said insulating film;

etching said protective film, said stopper film and said insulating film to define the contact hole which reaches said contact plug;

side etching said stopper film alone;

forming copper over an entire surface including said contact hole and said side-etched stopper film to thereby embed the copper in said contact hole; and polishing the copper by chemical mechanical polishing and terminating the polishing by said stopper film, wherein the copper does not contact said stopper film.

2. The method according to claim 1, wherein said stopper film is a film selected from the group consisting of C, BC, CN.

3. A method of embedding a groove by a damascene method, comprising:

forming an insulating film over an underbed having a contact plug;

successively forming a film and a protective film over an entire surface of the insulating film;

etching the protective film, the film and the insulating film, to define the groove which reaches the contact plug;

side etching the film;

forming copper over an entire surface of the protective film and including the groove and the side-etched film, to embed the groove with copper; and polishing the copper by chemical mechanical polishing and terminating the polishing by the film, wherein the copper does not contact the film.

4. The method according to claim 3, wherein the film is a film selected from the group consisting of C, BC, CN.

5. A method of manufacturing a semiconductor device, comprising:

forming a first insulating film over a substrate, the first insulating film having a contact hole;

filling the contact hole with a first conductive material;

forming a second insulating film on the first insulating film and the first conductive material;

forming a first film over a surface of the second insulating film, the first film being comprised of carbon or a carbon component;

forming a groove in the second insulating film and the first film located above the contact hole, wherein the first conductive material is exposed at a bottom of the groove;

depositing a second conductive material containing copper over the first film and in the groove; and polishing the second conductive material by chemical mechanical polishing so as to expose the first film, wherein the second conductive material remains in the groove, wherein a top surface of the first conductive material in the contact hole is completely covered by the second conductive material in the groove, after said polishing.

6. The method of claim 5, wherein the first film remains on the second insulating film after said polishing.

7. The method of claim 5, further comprising forming a second film including titanium between said forming a groove and said depositing a second conductive material, the second film being sandwiched between the second insulation film and the second conductive material in the groove.

8. The method of claim 7, wherein the second film is comprised of a titanium nitride film and a titanium film.

9. The method of claim 5, further comprising removing the first film after said polishing.

10. The method of claim 9, further comprising forming a second film including titanium between said forming a first insulating film and said filling the contact hole, the second film being sandwiched between the first insulation film and the first conductive material in the contact hole.

11. The method of claim 10, wherein the second film is comprised of a titanium film and a titanium nitride film.

12. The method of claim 5, further comprising forming a second film including titanium between said forming a first insulating film and said filling the contact hole, the second film being sandwiched between the first insulation film and the first conductive material in the contact hole.

13. The method of claim 12, wherein the second film is comprised of a titanium film and titanium nitride film.

14. The method of claim 12, further comprising forming a third film including titanium between said forming a groove and said depositing a second conductive material, the third film being sandwiched between the second insulation film and the second conductive material in the groove.

15. The method of claim 14, wherein the third film is comprised of a titanium nitride film and a titanium film.

16. The method of claim 5, further comprising forming a second film on the first film after said forming a first film, to protect against removal of the first film by ashing.

17. The method of claim 16, wherein the second film is comprised of a titanium nitride film.

18. The method of claim 16, further comprising removing a part of the first film, to disconnect the second conductive material from the first film.

19. The method of claim 18, wherein the first film is comprised of carbon or a carbon component.

20. The method of claim 16, further comprising forming a third film including titanium between said forming a groove and said depositing a second conductive material, the third film being sandwiched between the second insulation film and the second conductive material in the groove.

21. The method of claim 20, wherein the second film is comprised of a titanium nitride film.

22. The method of claim 20, wherein the third film is comprised of a titanium nitride film and a titanium film.

23. The method of claim 22, wherein the second film is comprised of a titanium nitride film.

24. The method of claim 16, wherein the second film is formed before said forming a groove.

25. The method of claim 24, wherein the second film is comprised of a titanium nitride film.

26. The method of claim 24, further comprising forming a third film including titanium between said forming a groove and said depositing a second conductive material, the third film being sandwiched between the second insulation film and the second conductive material in the groove.

27. The method of claim 26, wherein the second film is comprised of a titanium nitride film.

28. The method of claim 26, wherein the third film is comprised of a titanium film and a titanium nitride film.

29. The method of claim 28, wherein the second film is comprised of a titanium nitride film.

* * * * *